United States Patent
Chino et al.

(10) Patent No.: US 8,581,153 B2
(45) Date of Patent: Nov. 12, 2013

(54) METHOD OF DETECTING ABNORMAL PLACEMENT OF SUBSTRATE, SUBSTRATE PROCESSING METHOD, COMPUTER-READABLE STORAGE MEDIUM, AND SUBSTRATE PROCESSING APPARATUS

(75) Inventors: Takashi Chino, Nirasaki (JP); Satoshi Gomi, Nirasaki (JP); Koichi Miyashita, Nirasaki (JP); Minoru Nagasawa, Nirasaki (JP); Yoshie Eda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 176 days.

(21) Appl. No.: 13/000,140

(22) PCT Filed: Sep. 25, 2009

(86) PCT No.: PCT/JP2009/066644
§ 371 (c)(1),
(2), (4) Date: Mar. 22, 2011

(87) PCT Pub. No.: WO2010/038674
PCT Pub. Date: Apr. 8, 2010

(65) Prior Publication Data
US 2011/0174800 A1 Jul. 21, 2011

(30) Foreign Application Priority Data

Sep. 30, 2008 (JP) ................................. 2008-253937

(51) Int. Cl.
*H05B 3/68* (2006.01)
(52) U.S. Cl.
USPC ..................... 219/446.1; 219/444.1; 219/390; 219/510; 219/518; 700/121

(58) Field of Classification Search
USPC ........ 219/444.1, 446.1, 390, 510, 518, 121.4, 219/121.43, 121.41; 118/725, 728, 729; 392/416, 417, 418; 204/298, 298.09, 204/298.31, 298.32; 156/345, 345.24, 156/345.27, 345.51, 345.52, 345.53
See application file for complete search history.

(56) References Cited

U.S. PATENT DOCUMENTS 5,200,023 A * 4/1993 Gifford et al. ................... 216/59
5,702,624 A * 12/1997 Liao et al. ................... 219/444.1

(Continued)

FOREIGN PATENT DOCUMENTS

CN 101246833 A 8/2008
JP 10-189692 7/1998

(Continued)

OTHER PUBLICATIONS

International Search Report mailed on Oct. 20, 2009 for PCT/JP2009/066644.

*Primary Examiner* — Joseph M Pelham
*Assistant Examiner* — Jimmy Chou
(74) *Attorney, Agent, or Firm* — Smith, Gambrell & Russell, LLP (57) ABSTRACT

A method of detecting an abnormal placement of a substrate W, which is carried out when a substrate W placed on a substrate table 3, in which a heater 6a, 6b is disposed, is processed by heating. The method of detecting an abnormal placement of the substrate comprises the steps of: during processing of the substrate W, based on information about an electric output to the heater 6a, 6b or information about a measured temperature of the substrate table 3, detecting of a maximum value and a minimum value of the electric output or the measured temperature, or an integrated value of the electric output or the measured temperature; and judging of the abnormal placement of the substrate based on the maximum value and the minimum value detected, or the integrated value detected.

6 Claims, 8 Drawing Sheets

(56) References Cited

U.S. PATENT DOCUMENTS

| | | | |
|---|---|---|---|
| 5,875,416 A * | 2/1999 | Kanno | 702/130 |
| 5,956,489 A * | 9/1999 | San Andres et al. | 709/221 |
| 6,022,413 A * | 2/2000 | Shinozaki et al. | 118/715 |
| 6,100,506 A * | 8/2000 | Colelli et al. | 219/446.1 |
| 6,121,061 A * | 9/2000 | Van Bilsen et al. | 438/14 |
| 6,191,394 B1 * | 2/2001 | Shirakawa et al. | 219/444.1 |
| 6,303,895 B1 * | 10/2001 | Husain et al. | 219/121.4 |
| 6,310,327 B1 * | 10/2001 | Moore et al. | 219/405 |
| 6,313,441 B1 * | 11/2001 | Schaper et al. | 219/390 |
| 6,355,108 B1 * | 3/2002 | Won et al. | 118/728 |
| 6,592,673 B2 * | 7/2003 | Welch et al. | 118/676 |
| 6,654,668 B1 * | 11/2003 | Harada et al. | 700/299 |
| 6,723,201 B2 * | 4/2004 | Chen et al. | 156/345.24 |
| 6,980,876 B2 * | 12/2005 | Lin et al. | 700/121 |
| 6,985,215 B2 * | 1/2006 | Oh et al. | 356/72 |
| 7,156,924 B2 * | 1/2007 | Renken | 118/725 |
| 7,223,945 B2 * | 5/2007 | Shinya et al. | 219/492 |
| 7,247,819 B2 * | 7/2007 | Goto et al. | 219/444.1 |
| 7,601,933 B2 * | 10/2009 | Yoshihara et al. | 219/444.1 |
| 7,616,872 B2 * | 11/2009 | Camm et al. | 392/416 |
| 7,718,926 B2 * | 5/2010 | Matsuzawa et al. | 219/411 |
| 7,825,672 B2 * | 11/2010 | Peck et al. | 324/713 |
| 7,873,432 B2 * | 1/2011 | Ohminami et al. | 700/114 |
| 7,956,310 B2 * | 6/2011 | Koshimizu et al. | 219/497 |
| 8,222,570 B2 * | 7/2012 | Timans | 219/390 |
| 2002/0102511 A1 * | 8/2002 | Choi et al. | 432/253 |
| 2003/0155080 A1 * | 8/2003 | Chen et al. | 156/345.51 |
| 2004/0261930 A1 * | 12/2004 | Ogimoto | 156/64 |
| 2005/0092254 A1 * | 5/2005 | Davidson | 118/728 |
| 2005/0115945 A1 * | 6/2005 | Kesteren et al. | 219/390 |
| 2005/0189070 A1 * | 9/2005 | Tanaka et al. | 156/345.27 |
| 2005/0211669 A1 * | 9/2005 | Lam et al. | 216/60 |
| 2005/0223993 A1 * | 10/2005 | Blomiley et al. | 118/725 |
| 2006/0169900 A1 * | 8/2006 | Noji et al. | 250/310 |
| 2006/0213445 A1 * | 9/2006 | Blomiley et al. | 118/725 |
| 2007/0084847 A1 * | 4/2007 | Koshimizu et al. | 219/390 |
| 2007/0144673 A1 * | 6/2007 | Yeom | 156/345.54 |
| 2008/0156785 A1 * | 7/2008 | Ookura et al. | 219/162 |
| 2009/0050621 A1 * | 2/2009 | Awazu et al. | 219/444.1 |
| 2009/0098459 A1 * | 4/2009 | Takezawa et al. | 429/209 |
| 2009/0120584 A1 * | 5/2009 | Lubomirsky et al. | 156/345.51 |
| 2009/0144673 A1 * | 6/2009 | Goodnow et al. | 716/2 |
| 2009/0160472 A1 * | 6/2009 | Segawa et al. | 324/760 |
| 2010/0143575 A1 * | 6/2010 | Knaggs | 427/1 |

FOREIGN PATENT DOCUMENTS

| | | | |
|---|---|---|---|
| JP | 2000-306825 | | 11/2000 |
| JP | 2000306825 A | * | 11/2000 |
| JP | 2002-43231 | | 2/2002 |
| JP | 2002043231 A | * | 2/2002 |
| JP | 2006-283173 | | 10/2006 |
| JP | 2008-199023 | | 8/2008 |

* cited by examiner

METHOD OF DETECTING ABNORMAL PLACEMENT OF SUBSTRATE, SUBSTRATE PROCESSING METHOD, COMPUTER-READABLE STORAGE MEDIUM, AND SUBSTRATE PROCESSING APPARATUS

CROSS REFERENCE TO RELATED APPLICATIONS

This application is based upon and claims the benefit of priority from the prior Japanese Patent Application No. 2008-253937 filed on Sep. 30, 2008, the entire contents of which are incorporated herein by reference.

FIELD OF THE INVENTION

The present invention relates to: a method of detecting an abnormal placement of a substrate, which is carried out in a processing apparatus configured to heat a substrate such as a semiconductor wafer so as to perform processes such as a film deposition process, an etching process, a thermal process, a modification process, and a crystallization process, the method being capable of detecting, when the substrate is abnormally placed on a substrate table, the abnormal placement of the substrate; a substrate processing method utilizing the detecting method, a computer-readable storage medium used for the detecting method, and a substrate processing apparatus.

BACKGROUND ART

A processing apparatus, which is configured to perform a film deposition process to a substrate such as a semiconductor wafer in the course of manufacturing a semiconductor device, includes a substrate table for placing thereon the substrate in a chamber. The substrate is processed while the substrate is supported by the substrate table. In order to heat the substrate depending on process conditions, the substrate table incorporates a heater. For example, when a film deposition process by a thermal CVD method is performed, a temperature of the substrate table is heated by the heater to about 500° C. to 700° C. (for example, 3P2006-283173A).

However, there is a possibility that the substrate may float up from a table surface because of a foreign matter having entered into a space between the substrate table and the substrate and/or that the substrate may be placed on the substrate table at a displaced position that is deviated from a normal position because of a malfunction of a transfer apparatus. In this case, a problem may occur in that thermal conductivity from the substrate table to the substrate becomes non-uniform, so that a process result (for example, film thickness in a film deposition process) becomes non-uniform in a plane of the substrate. In addition, the same problem may occur, when the substrate itself warps so that the substrate partially floats up, and/or when the substrate table itself has a trouble such as deformation or damage so that the substrate is not normally placed.

When the substrate is abnormally placed because of a foreign matter, displacement, trouble of the substrate, or trouble of the substrate table, there has conventionally no method that is capable of detecting the abnormal placement of the substrate during the process. Thus, in almost all cases, a cause for a defective lot or a defective product is searched after the process, and the defectiveness is attributed to the abnormal placement of the wafer. Thus, once the abnormal placement occurs, the defective lots and the defective products are consecutively manufactured, which impairs a throughput.

SUMMARY OF THE INVENTION

The present invention has been made in view of the above circumstances. The object of the present invention is to provide a method capable of detecting an abnormal placement of a substrate on a substrate table at an earlier timing.

In order to solve the aforementioned problem, a method of detecting an abnormal placement of a substrate of the present invention is a method of detecting an abnormal placement of a substrate, which is carried out when a substrate placed on a substrate table, in which a heater is disposed, is processed by heating, the method comprising the steps of:

during processing of the substrate, based on information about an electric output to the heater or information about a measured temperature of the substrate table, detecting of a maximum value and a minimum value of the electric output or the measured temperature, or an integrated value of the electric output or the measured temperature; and judging of the abnormal placement of the substrate based on the maximum value and the minimum value detected, or the integrated value detected.

According to the method of detecting an abnormal placement of a substrate of the present invention, by using the maximum value and the minimum value or the integrated value of the electric output to the heater, or the maximum value and the minimum value or the integrated value of the temperature of the substrate table, as a reference index, the abnormal placement of the substrate can be judged for each time when one substrate is processed. Thus, a percent defective of products can be made minimum and a throughput can be improved. In addition, an additional equipment such as a sensor for detecting a placement position of the substrate is not necessary, the present invention can be easily applied to an existing equipment.

When the step of detecting is a step of detecting of the maximum value and the minimum value of the electric output or the measured temperature, the method of detecting an abnormal placement of a substrate of the present invention may further comprise a step of calculating of a difference between the maximum value and the minimum value, the step of judging includes judging of the abnormal placement of the substrate by comparing the difference with a predetermined threshold value. According to this feature, by comparing the difference between the maximum value and the minimum value with the preset threshold value, judgment of the abnormal placement of the substrate can be facilitated.

When the step of detecting is a step of detecting of the maximum value and the minimum value of the electric output or the measured temperature, the method of detecting an abnormal placement of a substrate of the present invention may further comprise steps of: calculating of a difference between the maximum value and the minimum value; and carrying out an operation to obtain an operation result by using the difference and a difference between a maximum value and a minimum value of the electric output or the measured temperature, which was obtained in processing of a previous substrate; the step of judging includes judging of the abnormal placement of the substrate by comparing the operation result with a predetermined threshold value. According to this feature, even when the state of the substrate table changes because of deposits caused by a film deposition process, for example, since the correction (operation) is carried out with the previous substrate processed under the same process conditions as a reference, the abnormal placement of the substrate can be precisely detected.

When the step of detecting is a step of detecting of an integrated value of the electric output or the measured temperature, in the method of detecting an abnormal placement of a substrate of the present invention, the step of judging may include judging of the abnormal placement of the substrate by comparing the integrated value with a predetermined threshold value. According to this feature, by comparing the integrated value with the preset threshold value, the judgment can be facilitated.

When the step of detecting is a step of detecting of the integrated value of the electric output or the measured temperature, the method of detecting an abnormal placement of a substrate of the present invention may further comprise a step of carrying out an operation to obtain an operation result by using the integrated value and an integrated value detected in processing of a previous substrate, the step of judging includes judging of the abnormal placement of the substrate by comparing the operation result with a predetermined threshold value. According to this feature, even when the state of the substrate table changes because of deposits caused by a film deposition process, for example, since the correction is carried out with the previous substrate processed under the same process conditions as a reference, the abnormal placement of the substrate can be precisely detected.

In this case, when the integrated value is represented as $A_1$ and the integrated value detected in processing of the previous substrate is represented as $A_0$, the operation result may be a ratio between the $A_1$ and $A_0$ or the operation result may be a difference between the $A_1$ and $A_0$.

When the step of detecting is a step of detecting of the maximum value and the minimum value of the electric output or the integrated value of the electric output, in the method of detecting an abnormal placement of a substrate of the present invention, the electric output to the heater may be one or more of supply power to the heater, supply current to the heater, and supply voltage to the heater.

These parameters are parameters of an electric output to the heater to be generally managed in the process. Thus, by using these parameters, a load on a control system can be reduced, and an application to an existing equipment is easy.

A substrate processing method of the present invention comprising the steps of:
  placing of a substrate on a substrate table, in which a heater is disposed;
  processing by heating of the substrate by the heater; and
  detecting of the abnormal placement of the substrate being processed;
  wherein the step of detecting of the abnormal placement includes the steps of:
  during processing of the substrate, based on information about an electric output to the heater or information about a measured temperature of the substrate table, detecting of a maximum value and a minimum value of the electric output or the measured temperature, or an integrated value of the electric output or the measured temperature; and
  judging of the abnormal placement of the substrate based on the maximum value and the minimum value detected, or the integrated value detected.

A computer-readable storage medium of the present invention is a computer-readable storage medium storing a control program executable on a computer,
  the control program being configured to cause the computer to carry out a method, which is carried out when a substrate placed on a substrate table, in which a heater is disposed, is processed by heating,
  the method comprising the steps of:
  during processing of the substrate, based on information about an electric output to the heater or information about a measured temperature of the substrate table, detecting of a maximum value and a minimum value of the electric output or the measured temperature, or an integrated value of the electric output or the measured temperature; and
  judging of the abnormal placement of the substrate based on the maximum value and the minimum value detected, or the integrated value detected.

A substrate processing apparatus comprising:
  a substrate table for placing thereon a substrate;
  a heater disposed in the substrate table, the heater being configured to heat the substrate placed on the substrate table;
  a heater power source electrically connected to the heater;
  a temperature measuring part configured to measure a temperature of the substrate table;
  a storage part configured to store an electric output to the heater or a measured temperature of the substrate table; and
  a judging part configured to detect a difference between a maximum value and a minimum value of the electric output to the heater or an integrated value of the electric output to the heater, or a difference between a maximum value and a minimum value of the measured temperature of the substrate table or an integrated value of the measured temperature of the substrate table, and judge an abnormal placement of the substrate based on the difference or the integrated value.

According to the method of detecting an abnormal placement of a substrate of the present invention, the maximum value and the minimum value or the integrated value are obtained from the electric output to the heater or the measured temperature of the substrate table. Then, based on the simple operation, the abnormal placement of the substrate can be exactly grasped at an earlier timing. Thus, a percent defective of products can be made minimum and a throughput can be improved.

In addition, the present method can be carried out without providing an equipment such as an optical sensor for detecting a substrate position. Thus, the present method can be easily applied to an existing equipment, and thus can serve many uses.

EMBODIMENTS FOR CARRYING OUT THE INVENTION

Figure 1:
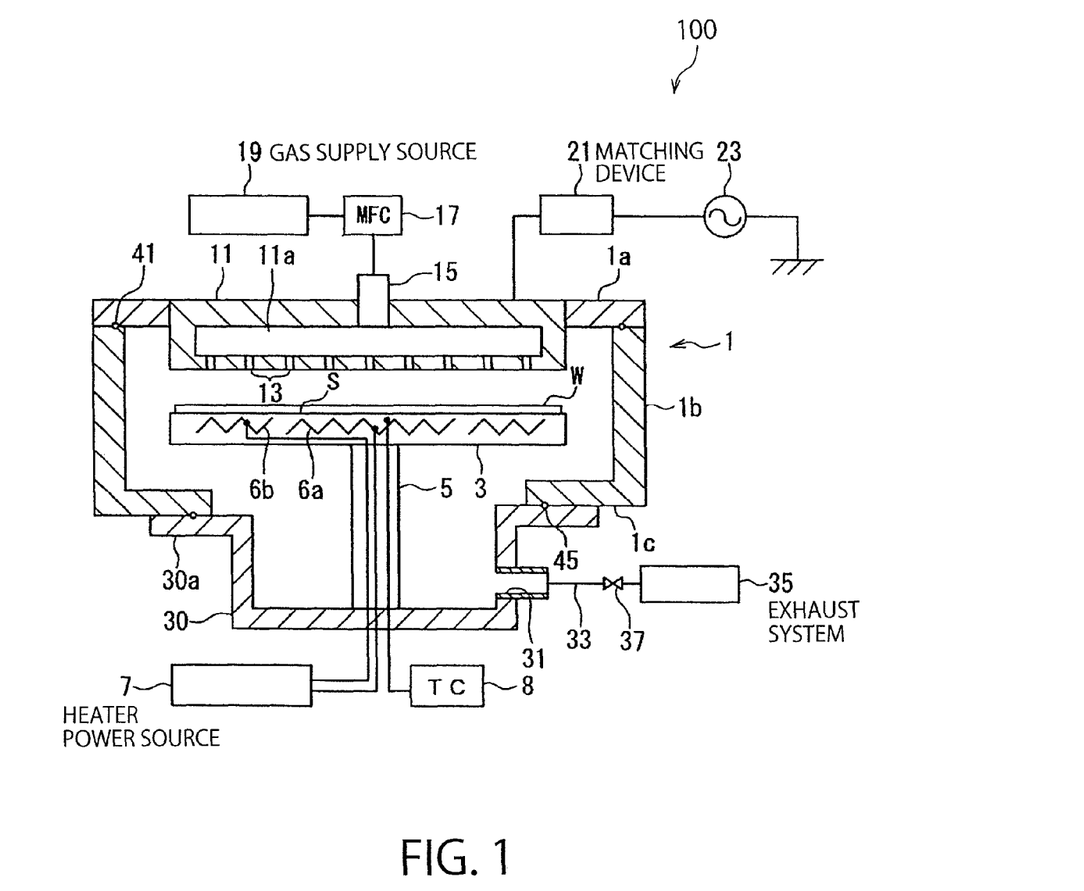
FIG. 1 is a sectional view showing a film deposition apparatus in one embodiment of the present invention.

Embodiments of the present invention will be described in detail below with reference to the drawings. FIG. 1 shows a schematic structural example of a film deposition apparatus 100 in one embodiment of a substrate processing apparatus. The film deposition apparatus 100 includes a substantially cylindrical processing vessel 1 capable of being hermetically sealed. In the processing vessel 1, there is disposed a stage 3 as a substrate table configured to horizontally support a semiconductor wafer (hereinafter referred to simply as "wafer") W as a substrate to be processed.

As shown in FIG. 1, the stage 3 is supported by a cylindrical support member 5. A heater 6a as heating means is embedded in a central area of the stage, which corresponds to a central part of the wafer W. A heater 6b is annularly embedded outside the heater 6a, i.e., a peripheral area of the stage, which corresponds to a peripheral part of the wafer W. The heaters 6a and 6b are resistance heaters for independently heating the wafer W as a substrate to be processed to a predetermined temperature by means of electricity supplied from a heater power source 7. In this embodiment, in consideration of the fact that a temperature difference tends to generate between the central part and the peripheral part of the wafer W, the two divided inside heater 6a and the outside heater 6b are disposed, so as to independently control temperatures for heating the two areas. In addition, the stage 3 is provided with a thermocouple (TC) (temperature measuring part) 8, such that a temperature of the stage 3 can be measured in real time.

Although not shown, the stage 3 has a plurality of support pins for elevating and lowering the wafer W while supporting the same, such that the support pins are projectable and retractable with respect to a table surface S of the stage 3. These support pins are displaced upward and downward by a given elevating mechanism. At an elevated position, the wafer W can be transferred between the stage 3 and a transfer apparatus (not shown).

As shown in FIG. 1, a showerhead 11 is disposed on a top plate 1a of the processing vessel 1. The showerhead 11 includes therein a gas diffusion space 11a. A number of gas jetting holes 13 communicating with the gas diffusion space 11a are formed in a lower surface of the showerhead 11. Connected to a central part of the showerhead 11 is a gas supply pipe 15 communicating with the gas diffusion space 11a. The gas supply pipe 15 is connected to a gas supply source 19 configured to supply a film-deposition material gas and so on, via a MFC (mass-flow controller) 17 and a plurality of not-shown valves.

Supplied from the gas supply source 19 to the showerhead 11 through the gas supply pipe 15 are a film-deposition material gas, a cleaning gas for cleaning an inside of the processing vessel 1, a purge gas for substituting an atmosphere in the processing vessel 1, and so on.

A radiofrequency power source 23 is connected to the showerhead 11 via a matching device 21. By means of radiofrequency power supplied from the radiofrequency power source 23 to the showerhead 11, a material gas supplied into the processing vessel 1 through the showerhead 11 can be made into a plasma state, so that a film can be deposited.

As shown in FIG. 1, an exhaust chamber 30 is connected to a bottom wall 1c of the processing vessel 1. An exhaust hole 31 is formed in a side part of the exhaust chamber 30. An exhaust system 35 is connected to the exhaust hole 31 through an exhaust pipe 33. The exhaust pipe 33 is provided with a valve 37, whereby the inside of the processing vessel 1 and the exhaust system 35 can be hermetically blocked. By actuating the exhaust system 35 with the valve 37 being opened, a pressure inside the processing vessel 1 can be reduced to a predetermined vacuum degree.

O-rings as sealing members are disposed on joint portions where the respective components constituting the processing vessel 1 are joined to each other, in order to hermetically seal the joint portions. In FIG. 1, an O-ring 41 is annularly disposed on the joint portion where the top plate 1a and a sidewall 1b are joined to each other, and an O-ring 45 is annularly disposed on the joint portion where the bottom wall 1c and a flange part 30a of the exhaust chamber 30 are joined to each other, for example.

In the film deposition apparatus 100 as structured above, the processing vessel 1 is vacuumized to create a vacuum therein, and a material gas is supplied from the showerhead 11 toward the wafer W, while the wafer W placed on the stage 3 is heated by the heaters 6a and 6b, whereby a predetermined thin film such as a Ti film or a TiN film is deposited on a surface of the wafer W by a CVD method. At this time, in order to enhance a film-deposition reaction efficiency, radiofrequency power may be supplied from the radiofrequency power source 23 to the showerhead 11.

Figure 2:
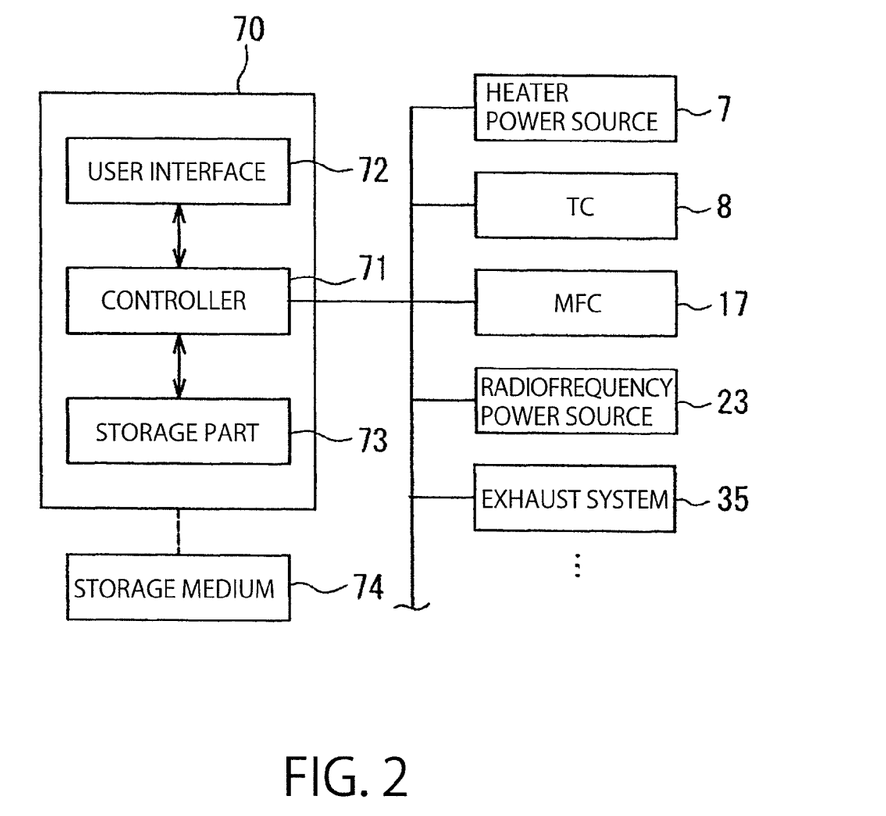
FIG. 2 is a block diagram showing a control system of the film deposition apparatus of FIG. 1.

The respective end devices (e.g., heater power source 7, thermocouple 8, MFC 17, radiofrequency power source 23, and exhaust system 35) constituting the film deposition apparatus 100 are connected to a control part 70 so as to be controlled by the control part 70. FIG. 2 shows a structural example of a control system in the film deposition apparatus 100. The control pat 70 includes a controller 71 as a computer having a CPU, a user interface 72 connected to the controller 71, and a storage part 73. The user interface 72 has a keyboard or a touch panel by which a step manager can input commands for managing the film deposition apparatus 100, and a display for visualizing a working state of the film deposition apparatus 100. The storage part 73 stores a control program (software) for realizing various processes performed by the film deposition apparatus 100 under the control of the controller 71, and recipes recording process condition data. Based on an instruction etc. from the user interface 72, a given control program and a recipe are called from the storage part 73 and executed by the controller 71 according to need. Thus, under the control of the controller 71, a desired process can be carried out in the processing vessel 1 of the film deposition apparatus 100.

The control program and the recipes of process condition data can be utilized by installing a program or recipes stored in a computer-readable storage medium 74 in the storage part 73. As the computer-readable storage medium 74, a CD-ROM, a hard disc, a flexible disc, a flash memory, and a DVD can be used, for example. It is also possible to use the recipes which are occasionally transmitted from another apparatus through a leased line, for example.

The controller 71 of the control part 70 controls electric outputs from the heater power source 7 to the heaters 6a and 6b. For example, the controller 71 controls supply power to the heaters 6a and 6b, supply current to the heaters 6a and 6b, and supply voltage to the heaters 6a and 6b. The above electric output from the heater power source 7 to the heater 6a or 6b is subjected to a feedback control based on measurement data about the temperature of the stage 3 measured by the thermocouple 8, such that a predetermined temperature set by the user interface 72 or the recipe is maintained. The electric output is automatically controlled such that, when the measured temperature of the stage 3 is higher than the set predetermined temperature, the electric output is restrained, and when the measured temperature of the stage 3 is lower, the electric output is increased. During processing of one wafer, data about the electric output and data about the temperature measured by the thermocouple 8 are stored in the storage part 73 as storage means (or may be stored in a RAM of the controller 71). Herein, "during processing of one wafer" means a period during which a desired process is performed to one wafer placed on the stage (substrate table) 3 in the processing vessel 1, based on a given control program and a recipe.

The controller 71 also functions as operating means. Namely, during processing of one wafer W, or within a period from when one wafer W is loaded into the processing vessel 1 and placed on the stage 3 to when the wafer W is unloaded from the processing vessel 1, the controller 71 obtains a maximum value and a minimum value of the electric output or the temperature, and calculates differences therebetween. In addition, during processing of one wafer, the controller 71 calculates integrated values of the electric output or temperature. Further, the controller 71 also functions as judging part that judges the abnormal placement of the wafer W, by comparing the obtained differences and the integrated values with, e.g., a predetermined threshold value.

[First Embodiment]

Figure 3:
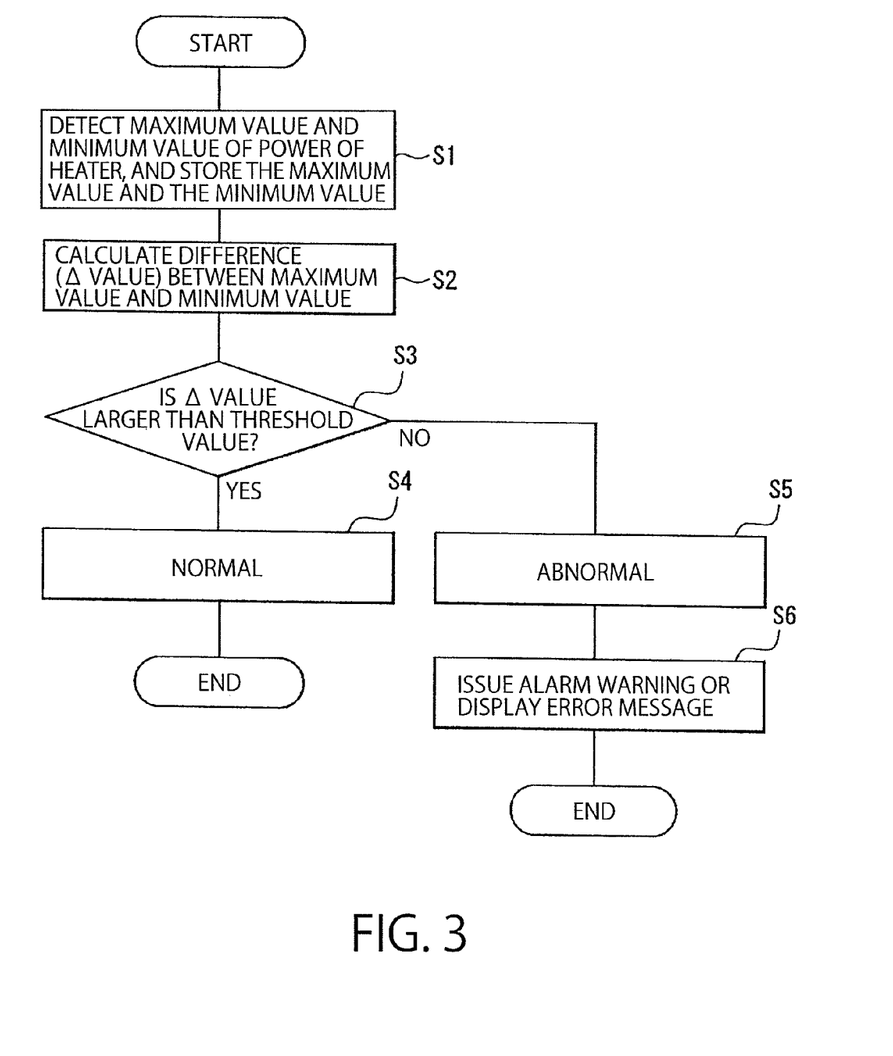
FIG. 3 is a flowchart showing a procedure of a method of detecting an abnormal placement in a first embodiment of the present invention.

Next, there is described a method of detecting an abnormal placement of a wafer W in a first embodiment of the present invention, which is carried out in the film deposition apparatus 100. FIG. 3 is a flowchart schematically showing a procedure of the method of detecting an abnormal placement of a wafer W in this embodiment. The method of detecting an abnormal placement is performed within a period during which one wafer W is processed by the film deposition apparatus 100. The method of detecting an abnormal placement may be directed to processes to all the wafers W, or to processes to some wafers selected among wafers in a lot.

In addition, there may be provided, in the control part 70, a flag resister part (not shown) that judges whether the detection of the abnormal placement is performed or not. In this case, with reference to the flag information of the flag resister part, whether to perform the detection of the abnormal placement or not can be selected, depending on film deposition conditions based on the recipe.

In a step S1 in FIG. 3, during processing of the one wafer W, a maximum value and a minimum value of power supplied from the heater power source 7 to the heater 6a (or heater 6b) are detected and stored in the storage part 73. The step S1 is performed by the controller 71. Values of the power outputted from the heater power source 7 during processing of the one wafer W are obtained by the controller 71 at intervals of one second, for example. During processing of the one wafer W, by sequentially updating the obtained maximum values and the minimum values of the power, a maximum value and a minimum value during the process can be detected at a time point when processing of the one wafer W is finished. The controller 71 stores the detected maximum value and the minimum value of the power in the storage part 73. It is not necessary to detect the maximum value and the minimum value of the power throughout processing of the one wafer W. The maximum value and the minimum value may be detected during a partial time of the process.

Then, in a step S2, the controller 71 calculates a difference between the maximum value and the minimum value (maximum value−(minus) minimum value) of the supply power from the heater power source 7 to the heater 6a (or heater 6b), the maximum value and the minimum value having been stored in the step S1. In this specification, the term "Δ value" is sometimes used as "difference between the maximum value and the minimum value" of the electric output or the temperature.

In a step S3, the Δ value of the supply power, which has been obtained in the step S2, is compared with a preset threshold value, so that whether the Δ value is larger than the preset threshold value or not is judged. The "threshold value" can be set with a certain margin, based on a Δ value when the wafer W is normally processed or a statistically average value thereof. When the Δ value is larger than the threshold value (Yes), the placement of the wafer W is judged as "normal" in a step S4. On the other hand, when the Δ value is not larger than the threshold value (No), the placement of the wafer W is judged as "abnormal" in a step S5. In this case, in a step S6, a warning by an alarm may be issued or an error message may be displayed on a monitor, for example. Alternatively, in the step S6, the film deposition apparatus 100 may be automatically stopped (the lot process may be interrupted).

Figure 4:
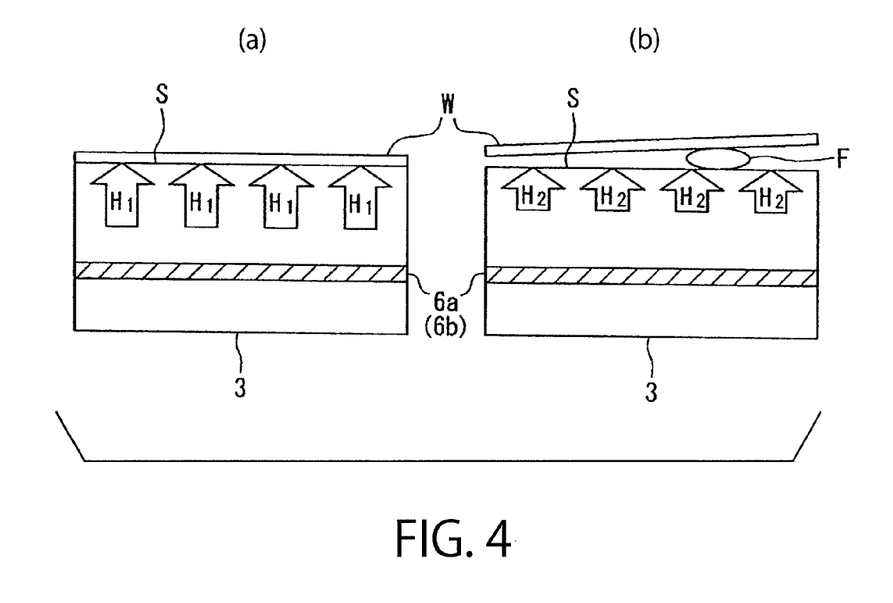
FIG. 4 is a view for explaining a difference between a normal placement of a wafer and an abnormal placement of a wafer.

In this embodiment, why the abnormal placement of the wafer W can be detected based on the Δ value is described. FIG. 4 schematically shows the placements of the wafer W on the stage 3. FIG. 4(a) shows the normal placement in which the wafer W surface-contacts the surface (table surface S) of the stage 3. FIG. 4(b) shows the abnormal placement in which the wafer W floats up from the surface (table surface S) of the stage 3 because of a foreign matter F interposed between the wafer W and the stage 3. In FIG. 4, the white arrows H1 and H2 schematically show heat conducted from the stage 3 to the wafer W. The size of the arrow shows an amount of the heat. As shown in FIG. 4(a), in the normal placement, since the wafer W and the stage 3 are in surface-contact with each other, the heat of the stage 3 effectively moves toward the wafer W which is relatively cold. On the other hand, as shown in FIG. 4(b), in the abnormal placement in which the wafer W floats up from the stage 3 because of the presence of the foreign matter F, since there is a gap between the stage 3 and the wafer W, less heat moves from the stage 3 to the wafer W. Thus, as compared with the state shown in FIG. 4(a), a temperature loss of the stage 3 is smaller in the state shown in FIG. 4(b).

As described above, the heater power source 7 that supplies power to the heater 6a (or heater 6b) is subjected to a feedback control for a set temperature based on the temperature measurement data by the thermocouple 8. Thus, when the temperature loss of the stage 3 is large, the supply power from the heater power source 7 is increased. On the other hand, when the temperature loss of the stage 3 is small, the supply power from the heater power source 7 is decreased. Namely, when the states of FIGS. 4(a) and 4(b) are compared with each other, the supply power from the heater power source 7 is smaller in the state of FIG. 4(b) in which less heat moves to the wafer W, than in the state of FIG. 4(a) in which the heat having moved to the wafer W should be compensated.

These differences in output can be more clearly distinguished, by calculating a difference (Δ value) between the maximum value and the minimum value of the output, which is an amplitude of the power outputted from the heater power source 7. Namely, sine less heat moves to the wafer W in the state of FIG. 4(b) as compared with the state of FIG. 4(a), the power outputted from the heater power source 7 is stabilized, whereby the Δ value becomes smaller. Thus, the abnormal placement of the wafer W can be detected and judged by comparing the measured Δ value with a predetermined threshold value which has been previously set based on the Δ value of the supply power from the heater power source 7 when the wafer W is normally placed. For example, when the Δ value is smaller than the threshold value, it means that an amount of heat moving from the stage 3 to the wafer W is abnormally smaller, which implies that the wafer is possibly, abnormally placed.

That is, when the wafer W is abnormally placed on the stage 3, because of presence of a foreign matter, displacement of the wafer W, deformation of the wafer W, and deformation or damage of the stage 3, the supply power from the heater power source 7 becomes smaller as compared when the wafer W is normally placed. The method in this embodiment utilizes the Δ value which explicitly demonstrates the abnormal placement of the wafer W.

According to the explanation based on the heat conduction from the stage 3 to the wafer W with reference to FIG. 4, it can be understood that the abnormal placement of the wafer W can be similarly detected by using, in place of the supply power from the heater power source 7 to the heater 6a (or heater 6b), another parameter relating to the electric output, such as a Δ value based on an output of supply voltage from the heater power source 7 to the heater 6a (or heater 6b), or a Δ value based on an output of supply current from the heater power source 7 to the heater 6a (or heater 6b).

In addition, it can be understood that the abnormal placement of the wafer W can be similarly detected by using an amplitude (Δ value) of the temperature of the stage 3, which is measured by the thermocouple 8, as a reference index. There is a time lag between a timing when variation of the temperature (lowering of temperature) has been measured by the thermocouple 8, and a timing when the temperature of the stage 3 is recovered by increasing power to be supplied from the heater power source 7 to the heater 6a (heater 6b) based on the feedback control. Thus, when the wafer W which is colder than the stage 3 is normally placed on the stage 3, the temperature measured by the thermocouple 8 is once lowered, and it takes a little time until the temperature is recovered by the feedback control. This phenomenon can be seen by the Δ value of the temperature. On the other hand, when the wafer W is abnormally placed, since the temperature is hardly lowered, the Δ value is small. Namely, when the Δ value of the measured temperature of the stage 3 is used as a reference index, since less heat moves to the wafer W that is abnormally placed as compared with the wafer W that is normally placed, the measured temperature is stabilized so that the Δ value becomes smaller. Thus, similarly to the electric output of the heater 6a (or heater 6b), the abnormal placement of the wafer W can be detected by the Δ value as the amplitude of the measured temperature.

As described above, in this embodiment, by using one or more of the supply power, the supply voltage, and the supply current from the heater power source 7 to the heater 6a (or heater 6b), or the measured temperature of the stage 3, as a reference index, the abnormal placement of the wafer W can be detected for a brief period of time, by calculating an amplitude (Δ value) of the parameters and comparing the amplitude with a threshold value. In the stage 3 of the film deposition apparatus 100 shown in FIG. 1 including the heaters 6a and 6b for independently controlling the central area and the peripheral area, one of the heaters 6a and 6b may be subjected to the method shown in FIG. 3. However, both the heaters 6a and 6b may be subjected to the method shown in FIG. 3. Further, it is apparent that this detecting method can be similarly applied to a stage having such a heater structure that controls the overall stage as one area.

[Second Embodiment]

Figure 5:
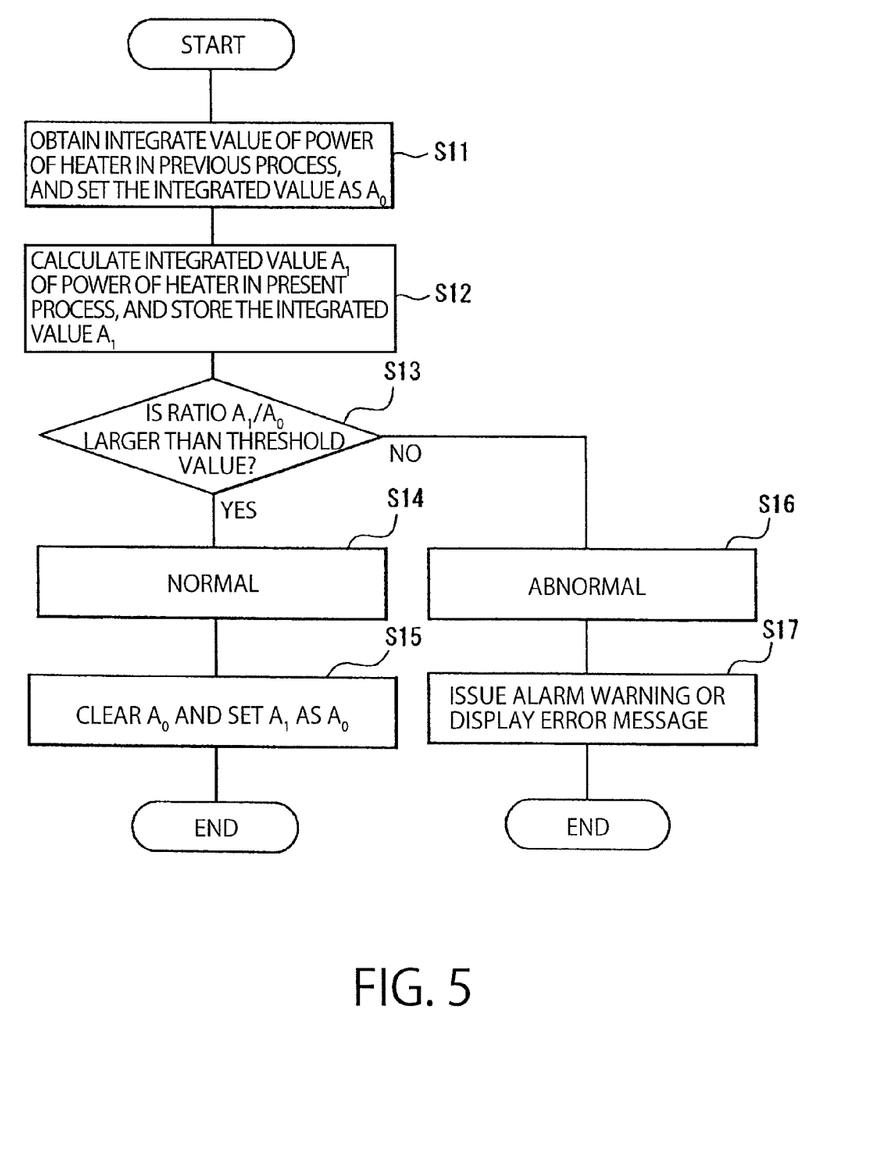
FIG. 5 is a flowchart showing a procedure of the method of detecting an abnormal placement in a second embodiment of the present invention.

Next, there is described the method of detecting abnormal placement of a wafer W in a second embodiment of the present invention, which is carried out in the film deposition apparatus 100. FIG. 5 is a flowchart schematically showing a procedure of the method of detecting an abnormal placement of a wafer W in this embodiment. In the following description, differences from the first embodiment are mainly explained, and explanation of the same structure is omitted.

In the first embodiment, the difference (Δ value) between the maximum value and the minimum value of the electric output to be supplied from the heater power source 7 to the heater 6a (or heater 6b) or the measured temperature of the stage 3 is calculated, and the abnormal placement of a wafer W is detected by comparing the Δ value as a reference index with a predetermined threshold value. On the other hand, instead of the Δvalue, an integrated value of the electric output or the measured temperature is calculated, and the abnormal placement of the wafer W is detected by comparing the integrated value as a reference index with a predetermined threshold value.

In addition, this embodiment differs from the first embodiment in that, before the comparison with a threshold value, an integrated value is corrected on the basis of an integrated value of the electric output or the measured temperature of a previous wafer W which has been processed under the same process conditions ("previous wafer" means a last wafer W in a previous lot that has been processed based on the same recipe, or an immediately precedent wafer W in the same lot). The method of correcting may be carrying out an operation such as a method of calculating a ratio between an integrated value in the previous process and an integrated value in the present process, or a method of calculating a difference between an integrated value in the previous process and an integrated value in the present process. Herein, there is applied the method of calculating a ratio between an integrated value in the previous process and an integrated value in the present process.

In a step S11 of FIG. 5, an integrated value of a supply power from the heater power source 7 to the heater 6a (or heater 6b), which was detected when a previous wafer W was processed, is set as $A_0$. The previous wafer W was processed under the same process conditions as those of the process to be performed from now in the film deposition apparatus 100 (the previous process and the present process are based on the same recipe). Since the integrated value $A_0$ or data about the supply power as a basis therefor is stored in the storage part 73, the integrated value $A_0$ can be calculated when the controller 71 refers to the data.

In a step S12, during processing of the one present wafer W, an integrated value $A_1$ of the supply power from the heater power source 7 to the heater 6a (or heater 6b) is calculated and stored in the storage part 73. In the step S12, the controller 71 obtains values of the power outputted by the heater power source 7 during processing of the one wafer W at intervals of one second, for example. By sequentially adding the values, an integrated value can be easily calculated. The controller 71 stores the calculated integrated value $A_1$ in the storage part 73.

Then, in a step S13, the controller 71 calculates a ratio $A_1/A_0$ from the integrated value $A_0$ set in the step S11 and the integrated value $A_1$ calculated in the step S12, and compares the value with a predetermined threshold value. When the ratio $A_1/A_0$ is larger than the threshold value (Yes), the placement of the wafer W is judged as "normal" in a step S14. In this case, in a step S15, the integrated value $A_0$ is cleared, and the integrated value $A_1$ obtained in the step S12 is newly set as "previous integrated value $A_0$".

On the other hand, in the step A13, when the ratio $A_1/A_0$ is not larger than the threshold value (No), the placement of the wafer W is judged as "abnormal" in a step S16. In this case, in a step S17, a warning by an alarm may be issued or an error message may be displayed on a monitor, for example.

In this embodiment, although the integrated value ratio $A_1/A_0$ of the supply power from the heater power source 7 to the heater 6a (or heater 6b) is used as a reference index, in place of the $\Delta$ value used in the first embodiment, the basic principle is the same as that of the first embodiment. Namely, when the wafer W is abnormally placed because of a foreign matter or displacement etc., since less heat moves from the stage 3 to the wafer W, the temperature of the stage 3 is not so much lowered. Thus, the supply power from the heater power source 7 becomes smaller as compared when the wafer W is normally placed. Thus, this embodiment utilizes the variation (decrease) in the integrated value $A_1$ which explicitly demonstrates the abnormal placement of the wafer W (see, FIG. 4).

The abnormal placement of the wafer W can be similarly detected by using, in place of the integrated value of the output of the supply power from the heater power source 7 to the heater 6a (or heater 6b), another electric output such as an integrated value of an output of supply voltage from the heater power source 7 to the heater 6a (or heater 6b) or an integrated value of an output of supply current from the heater power source 7 to the heater 6a (or heater 6b).

In addition, the abnormal placement of the wafer W can be similarly detected by using an integrated value of the measured temperature of the stage 3, which is measured by the thermocouple 8. As described above, when the wafer W colder than the stage 3 is normally placed on the stage 3, there is a time lag between a timing when variation of the temperature (lowering of temperature) has been measured by the thermocouple 8, and a timing when the temperature of the stage 3 is recovered by increasing power to be supplied from the heater power source 7 to the heater 6a (heater 6b) based on the feedback control. In the course of recovering the temperature of the stage 3 by increasing the power to be supplied from the heater power source 7 to the heater 6a (or heater 6b), an overshoot occurs because of the time lag. Namely, the temperature of the stage 3 (temperature measured by the thermocouple 8) increases until the temperature of the stage 3 once exceeds a set temperature, and the temperature gradually comes near the set temperature. Due to the overshoot, when the wafer W is normally placed, the integrated value of the measured temperature of the stage 3 becomes larger. When the wafer W is abnormally placed, since less heat moves to the wafer W, the measured temperature is stabilized near the set temperature. Since no overshoot occurs, the integrated value of the measured temperature becomes smaller. Thus, similarly to the electric output of the heater 6a (or heater 6b), the abnormal placement of the wafer W can be detected by the integrated value of the measured temperature.

This embodiment differs from the first embodiment in that the integrated value of the electric output which is obtained in processing of the previous wafer W is set as "previous integrated value $A_0$", and the value $A_0$ is newly set for each time when a succeeding wafer W is processed. The reason therefor is as follows. A thermal process performed by heating the wafer W by means of the stage 3 has two purposes. One is to introduce (diffuse) elements into the inside of the wafer W, which is performed by an oxidizing process and a nitriding process by a plasma. The other is to deposit atoms or molecules on the surface of the wafer W, which is performed by a CVD process. In the latter (deposition) film deposition process, deposits accumulate on the respective components in the processing vessel 1 including the stage 3, for each time when a wafer W is processed. As a result, reflected heat and radiant heat in the processing vessel 1 gradually change, so that a heat conductance efficiency from the stage 3 to a wafer W change little by little with repeated processes.

In a case of the film deposition process in which the environment in the processing vessel 1 changes in accordance with the number of processed wafers W, it is preferable to correct a parameter on the basis of an electric output or a measured temperature in the normal previous process, upon comparison with a fixed threshold value for judgment. Thus, in this embodiment, each time one wafer W is processed, the integrated value $A_0$ is newly set as described above. In this case, as long as the wafer is normally placed on the stage 3, the integrated value ratio $A_1/A_0$ will be a substantially constant value. Thus, by comparing the value with the threshold value, the abnormal placement of the wafer W can be precisely detected. In place of the integrated value ratio $A_1/A_0$, an integrated value ratio $A_0/A_1$ may be calculated, so as to similarly detect the abnormal placement of the wafer W.

It is not necessary to calculate the integrated value throughout processing of the one wafer W. Namely, it is possible to calculate the integrated value for only a period during which an electric output or a measured temperature is likely to change because of the abnormal placement (for example, a certain period from when the introduction of a film deposition gas to the processing vessel 1 has been started).

As described above, in this embodiment, by using the integrated value of one or more of the supply power, the supply voltage, and the supply current from the heater power source 7, or the integrated value of the measured temperature of the stage 3, as a reference index, the abnormal placement of the wafer W can be detected for a brief period of time, by comparing the ratio $A_1/A_0$ with a threshold value. Alternatively, instead of the integrated value ratio $A_1/A_0$, an integrated value difference $A_1-A_0$ may be calculated, and the difference may be compared with a preset threshold value (value different from the threshold value to be compared with the ratio $A_1/A_0$). In this case, when the wafer W is abnormally placed, the difference $A_1-A_0$ is a negative value. Thus, by setting a negative value as a threshold value, it is possible to judge the placement normal when the difference $A_1-A_0$ is not less than the threshold value, and to judge the placement abnormal when the difference $A_1-A_0$ is smaller than the threshold value. Alternatively, it is possible to use an absolute value of the difference $A_1-A_0$. In this case, when the absolute value of the difference $A_1-A_0$ is smaller than a predetermined threshold value (positive value), the placement is judged as normal. On the other hand, when the absolute value of the difference $A_1-A_0$ is not smaller than the threshold value (i.e., not less than the threshold value), the placement is judged as abnormal. Alternatively, instead of the integrated value difference $A_1-A_0$, it is possible to calculate an integrated value difference $A_0-A_1$, so as to similarly detect the abnormal placement of the wafer W.

In a case of the process where less deposits generate, so that the inside environment of the processing vessel 1 is not likely to change, it is possible to omit the correction (i.e., without setting the integrated value $A_0$) similarly to the first embodiment, and to judge the placement based on the comparison between the integrated value $A_1$ itself and a predetermined threshold value (value different from the threshold value to be compared with the ratio $A_1/A_0$ or the difference $A_1-A_0$).

The other structure, the operation and the effect in this embodiment are the same as those of the first embodiment.

In addition, it is possible to carry out an operation so as to obtain an operation result by calculating a difference between a maximum value and a minimum value of the electric output to the heater 6a (or heater 6b) or a difference between a maximum value and a minimum value of the measured temperature of the stage 3, which is obtained in processing of the present wafer W, and a difference between a maximum value and a minimum value of the electric output to the heater 6a (or heater 6b) or a difference between a maximum value and a minimum value of the measured temperature of the stage 3, which is obtained in processing of the previous wafer W. In this case, similarly to the above, by comparing the operation result and a threshold value, the placement of the substrate is judged.

As the operation method, it is possible to obtain a operation result by calculating a ratio between: the difference between the maximum value and the minimum value of the electric output to the heater 6a (or heater 6b) or the measured temperature of the stage 3, which is obtained in processing of the present wafer W; and the difference between the maximum value and the minimum value of the electric output to the heater 6a (or heater 6b) or the measured temperature of the stage 3, which is obtained in processing of the previous wafer W. Alternatively, it is possible to obtain a operation result by calculating a difference between: the difference between the maximum value and the minimum value of the electric output to the heater 6a (or heater 6b) or the measured temperature of the stage 3, which is obtained in processing of the present wafer W; and the difference between the maximum value and the minimum value of the electric output to the heater 6a (or heater 6b) or the measured temperature of the stage 3, which is obtained in processing of the previous wafer W.

Figure 6:
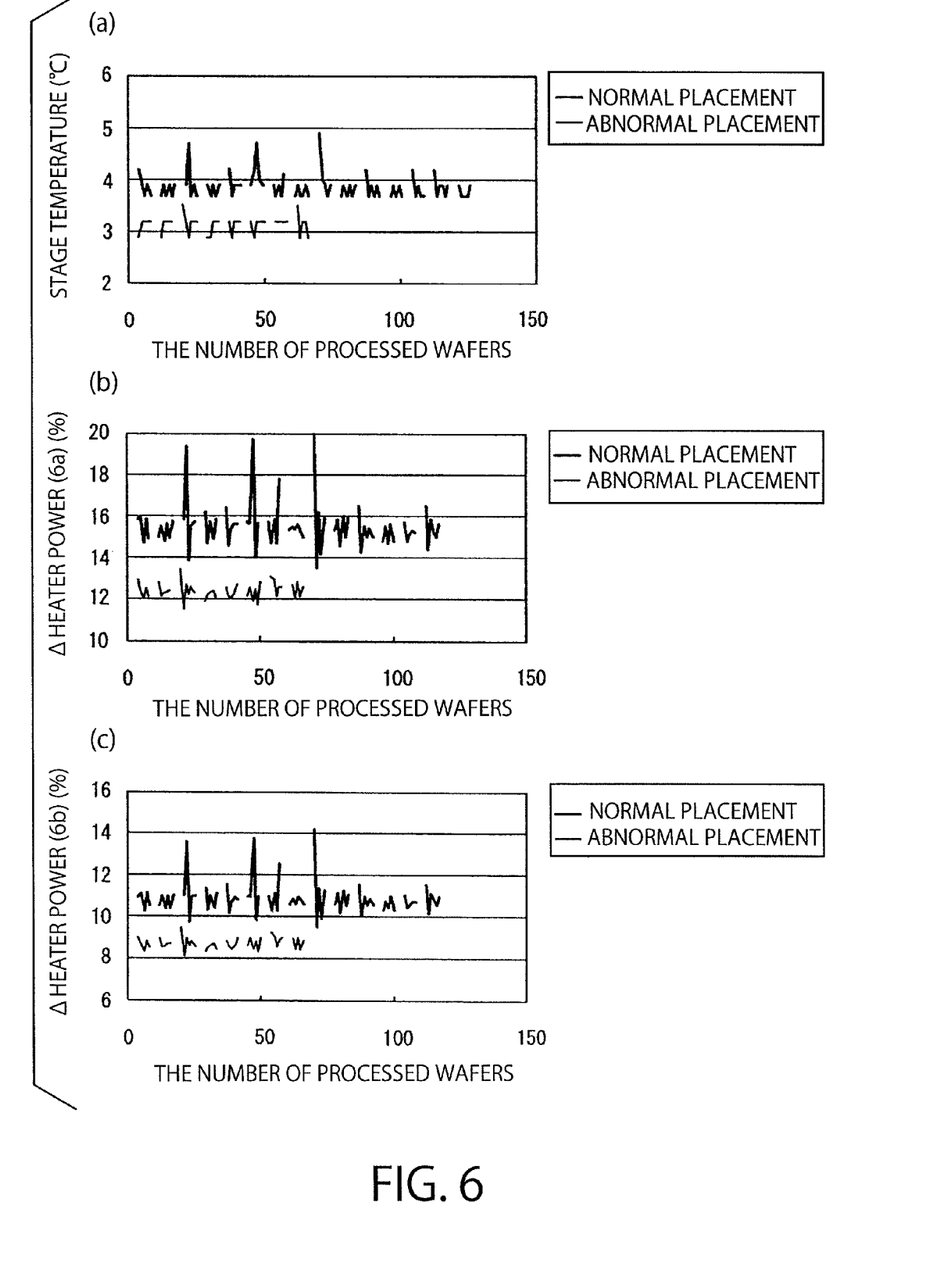
FIG. 6 is a graph showing a change in a measured temperature of the stage and a change in a Δ value of a supply power to the heater, when the wafer was normally placed and when the wafer was abnormally placed.

Next, experiment data as a basis of the present invention are described. The Δ value (maximum value–(minus) minimum value) of the measured temperature of the stage 3, the Δ value of the supply power to the heater 6a, and the Δ value of the supply power to the heater 6b are plotted, for cases when wafers W normally placed were processed in the film deposition apparatus 100, and when wafers W abnormally placed were processed in the film deposition apparatus 100. An axis of ordinate in FIG. 6(a) shows the Δ value of the measured temperature, an axis of ordinate in FIG. 6(b) shows the Δ value of the supply power to the heater 6a, and an axis of ordinate in FIG. 6(c) shows the Δ value of the supply power to the heater 6b. The data shows a case in which one of components of a lifter mechanism, which supports the wafer W so as to be moved upward and downward on the stage 3, was broken, and the fragment thereof was interposed between the stage 3 and the wafer W, whereby the wafers W were abnormally placed. In FIGS. 6(a) to 6(c), since the parameters tend to vary by a factor other than the abnormal placement, the data about the first to third wafers in a lot are omitted.

The normal placement and the abnormal placement are compared with each other. As shown in FIG. 6(a), the Δ value of the measured temperature in the abnormal placement was significantly lower than that in the normal placement. As shown in FIGS. 6(a) and 6(b), the Δ value of each supply power in the abnormal placement was significantly lower than that in the normal placement. In addition, since a certain width was observed between the Δ value in the normal placement and the Δ value in the abnormal placement, it could be understood that a threshold value can be set therebetween. Thus, it could be confirmed that the abnormal placement of the wafer W on the stage 3 can be detected by detecting the Δ value in the normal placement and the Δ value in the abnormal placement, and by comparing the Δ value with a preset threshold value.

Figure 7:
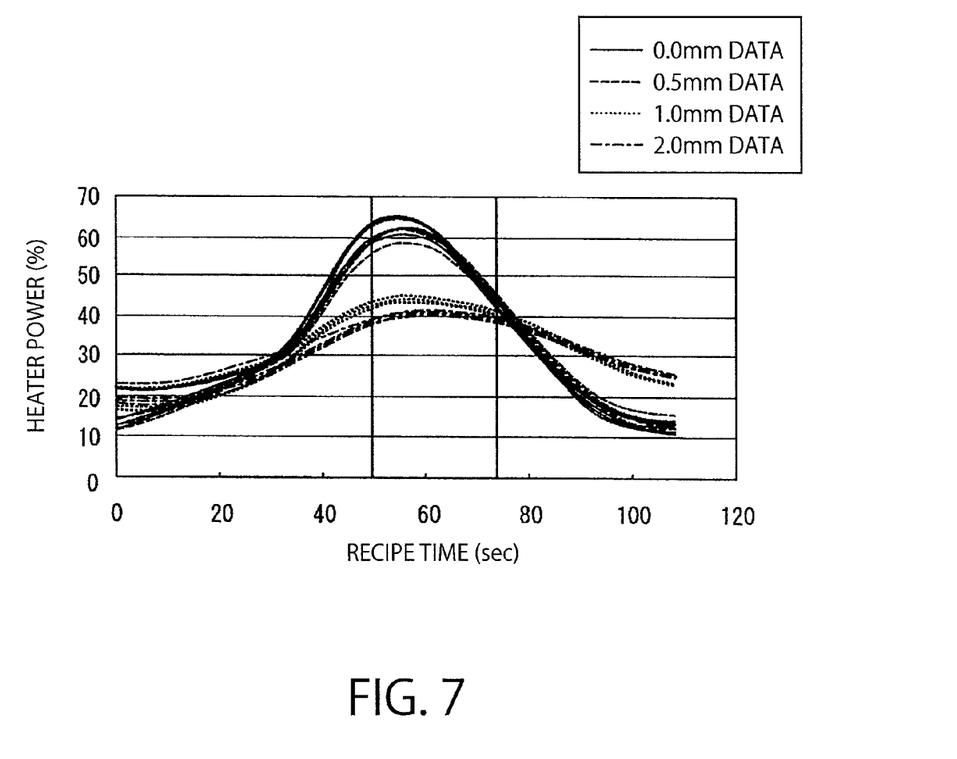
FIG. 7 is a graph showing a change with time in a supply power to the heater, when the wafer was normally placed and when the wafer was abnormally placed.

FIG. 7 is a graph showing a relationship between a process time and a change in the supply power to the heater 6a, when a process was carried out in the film deposition apparatus 100 in accordance with a TiN film-deposition recipe. In this example, the experiment was conducted, with gaps (floating spaces) between the stage 3 and the wafer W being intentionally set at 0.0 mm (normal surface-contact state), 0.5 mm, 1.0 mm and 2.0 mm.

In FIG. 7, the schematic abnormal placement of the 0.5-mm floating space did not largely differ from the normal placement (0.0 mm). However, the schematic abnormal placements of 1.0-mm and 2.0-mm floating spaces largely differed from the normal placement (0.0 mm) in the supply power to the heater within the process time ranging from the start of the process to about 50 to 70 seconds thereafter. The time between 50 seconds and 70 seconds was a section where the pressure in the processing vessel 1 was increased by introducing a TiN material gas into the processing vessel 1, so that the pressure reached about 667 Pa as a set film-deposition pressure and stabilized. Thus, in the TiN film deposition based on the recipe, it could be confirmed that, by calculating the Δ value or the integrated value of the supply power to the heater 6a within the process time ranging from the start of the process to about 50 to 70 seconds thereafter, the judgment of the normal placement and the abnormal placement can be easily performed. In this manner, by detecting the Δ value or the integrated value not throughout processing of one wafer W but in a section thereof, there is a case in which a precise judgment can be achieved.

Figure 8:
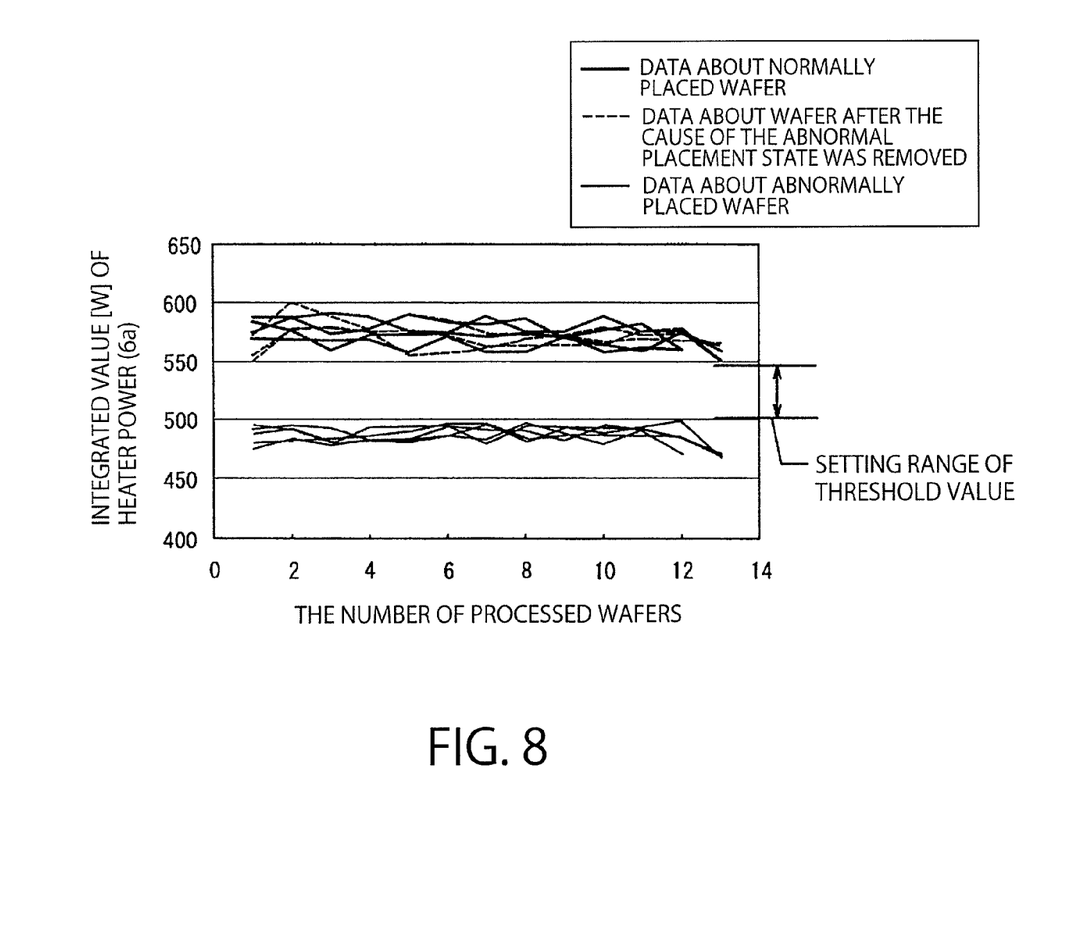
FIG. 8 is a graph showing an integrated value of a supply power to the heater, when the wafer was normally placed and when the wafer was abnormally placed.

In FIG. 8, the integrated values of the supply power to the heater 6a are plotted for a case in which wafers W were normally placed and processed by the film deposition apparatus 100, a case in which wafers W were abnormally placed and processed by the film deposition apparatus 100, and a case in which wafers W (in the normal placement state), after the cause of the abnormal placement state was removed, were processed in the film deposition apparatus 100. As shown in FIG. 8, the integrated value in the normal placement and the integrated value in the abnormal placement largely differed in the supply power to the heater 6a. It was confirmed that, since there is a sufficient width (gap between the lines on the graph of FIG. 8) between the integrated value in the normal placement and the integrated value in the abnormal placement, it is easy to set a threshold value therebetween as a given value. Thus, it was confirmed that, the abnormal placement of the wafer W on the stage 3 can be detected by calculating the integrated values of the supply powers to the heater 6a in the normal placement and the abnormal placement, and by comparing the values with a threshold value.

In addition, there was conducted an experiment where the abnormal placement of a wafer W was detected, while wafers W were processed in the film deposition apparatus 100, based on a TiN film-deposition recipe. In the TiN film deposition process, deposits adheres to the inside of the processing vessel 1 for each time when a wafer W is processed, whereby the environment in the processing vessel 1 changes. Thus, in this experiment, an integrated value ratio $A_1/A_0$ and an integrated value difference $A_1-A_0$ were calculated based on a calculated integrated value $A_1$ of the supply power to the heater 6a (6b) and an integrated value $A_0$ which had been similarly calculated in processing of a previous wafer W, and correction was carried out. Table 1 shows the result.

TABLE 1

| | The Number of Wafers | | | | | |
| --- | --- | --- | --- | --- | --- | --- |
| | n − 5 | n − 4 | n − 3 | n − 2 | n − 1 | n |
| Integrated Value $A_1$ [W] | 569.9 | 572.3 | 558.2 | 561.6 | 560.3 | 494.6 |

TABLE 1-continued

|  | The Number of Wafers | | | | | |
| --- | --- | --- | --- | --- | --- | --- |
|  | n − 5 | n − 4 | n − 3 | n − 2 | n − 1 | n |
| Ratio $A_1/A_0$ | — | 1.025 | 0.975 | 1.006 | 0.998 | 0.883 |
| Difference $A_1 − A_0$ | — | 14.2 | −14.1 | 3.4 | −1.3 | −65.7 |

In Table 1, the integrated value $A_1$ was remarkably lowered in processing of the n-th wafer W, and the occurrence of the abnormal placement was detected. In this experiment, even when the original integrated value $A_1$ was compared with a predetermined threshold value (e.g., 500 W), the abnormal placement of the wafer W could be detected. In Table 1, it can be understood that the ratio $A_1/A_0$ or the difference $A_1-A_0$ remarkably changes in processing of the n-th wafer W. Thus, by comparing the ratio $A_1/A_0$ with a predetermined threshold value (e.g., 0.9) or by comparing the difference $A_1-A_0$ with a predetermined threshold value (e.g., −40), the abnormal placement of the wafer W could be detected.

From the above results, it could be confirmed that the abnormal placement of the wafer W can be clearly detected by calculating the ratio $A_1/A_0$ or the difference $A_1-A_0$ between the integrated value $A_1$ of the supply power to the heater 6a (6b) and the integrated value $A_0$ in processing of the previous wafer. W, and comparing the ratio $A_1/A_0$ or the difference $A_1-A_0$ with a predetermined threshold value.

Although the embodiments of the present invention have been described above, the present invention is not limited thereto and can be variously modified. For example, in the above embodiments, the film deposition apparatus 100 is taken as an example of a vacuum apparatus. However, not limited to a film deposition apparatus, the present invention can be applied to any processing apparatus without special limitation, as long as the processing apparatus performs a predetermined process while heating a substrate.

Further, in the above embodiments, whether a substrate is placed normally or abnormally is judged by comparing the Δ value or the integrated value with a threshold value. However, it is possible to set a plurality of threshold values, so as to detect the abnormal placement step by step (e.g., a mild abnormal placement and a severe abnormal placement). In this case, since a more detailed judgment can be achieved, notice display such as an alarm and an error message, and an emergency measure such as automatic shutdown of the apparatus can be set and selected in accordance with a level of the detected abnormal placement.

In the aforementioned respective embodiments, there is described a single-wafer processing apparatus having the one stage (substrate table) 3 in the processing vessel 1, so as to process a wafer (substrate) one by one, for example. However, not limited thereto, the present invention can be applied to a batch-type processing apparatus having the plurality of stages (substrate tables) 3 in the processing vessel 1, so as to simultaneously process a plurality of wafers (substrates).

In the aforementioned respective embodiments, the semiconductor wafer is taken as an example of a substrate as an object to be processed. However, not limited thereto, the present invention can be applied to a glass substrate, an LCD substrate, and a ceramic substrate.

The invention claimed is:

1. A method of detecting an abnormal placement of a substrate, which is carried out when a film deposition process is performed to a substrate placed on a substrate table, in which a heater is disposed, by supplying a material gas and heating the substrate, the method comprising the steps of:
during processing of the substrate, based on data representing one or more of supply power to the heater, supply current to the heater, and supply voltage to the heater, or representing a measured temperature of the substrate table, calculating a difference between a maximum value and a minimum value of said data;
carrying out an operation to obtain an operation result by using the difference calculated and a difference between a maximum value and a minimum value of one or more of the supply power to the heater, the supply current to the heater, and the supply voltage to the heater, or of the measured temperature of the substrate table, which corresponding difference was obtained in processing of a previous substrate; and
judging of the abnormal placement of the substrate by comparing the operation result with a predetermined threshold value.

2. A method of detecting an abnormal placement of a substrate
which is carried out when a film deposition process is performed on a substrate placed on a substrate table, in which a heater is disposed, and the substrate is processed by supplying a material gas and heating, said method comprising the steps of:
during processing of the substrate, detecting an integrated value of data representing one or more of supply power to the heater, supply current to the heater, and supply voltage to the heater, or representing a measured temperature of the substrate table;
carrying out an operation to obtain an operation result by using the integrated value detected and an integrated value detected during processing of a previous substrate; and
judging the abnormal placement of the substrate by comparing the operation result with a predetermined threshold value.

3. The method of detecting an abnormal placement of a substrate according to claim 2, wherein
when the integrated value is represented as $A_1$ and the integrated value detected in processing of the previous substrate is represented as $A_0$, the operation result is a ratio between the $A_1$ and $A_0$.

4. The method of detecting an abnormal placement of a substrate according to claim 2, wherein
when the integrated value is represented as $A_1$ and the integrated value detected in processing of the previous substrate is represented as $A_0$, the operation result is a difference between the $A_1$ and $A_0$.

5. A substrate processing apparatus for performing a film deposition process to a substrate by supplying a material gas, said apparatus comprising:
a substrate table for placing thereon a substrate;
a heater disposed in the substrate table, the heater being configured to heat the substrate placed on the substrate table;
a heater power source electrically connected to the heater;
a temperature measuring part configured to measure a temperature of the substrate table;
a storage part configured to store data representing one or more of supply power to the heater, supply current to the heater, and supply voltage to the heater from the power source, or representing a measured temperature of the substrate table from the temperature measuring part; and a judging part configured to calculate a difference between a maximum value and a minimum value of said data to carry out an operation to obtain an operation result by using the difference calculated and a difference between a maximum value and a minimum value of one or more of the supply power to the heater, the supply current to the heater, and the supply voltage to the heater, or of the measured temperature of the substrate table, which corresponding difference was obtained in processing of a previous substrate, and to judge an abnormal placement of the substrate by comparing the operation result with a predetermined threshold value.

6. A substrate processing apparatus for performing a film deposition process to a substrate by supplying a material gas, said apparatus comprising:

a substrate table for placing thereon a substrate;

a heater disposed in the substrate table, the heater being configured to heat the substrate placed on the substrate table;

a heater power source electrically connected to the heater;

a temperature measuring part configured to measure a temperature of the substrate table;

a storage part configured to store data representing one or more of supply of power to the heater, supply of current to the heater, and supply of voltage to the heater from the heater power source, or representing a measured temperature of the substrate table from the temperature measuring part; and a judging part configured to detect an integrated value of the data stored to carry out an operation to obtain an operation result by using the integrated value detected and an integrated value detected in processing of a previous substrate, and to judge an abnormal placement of the substrate by comparing the operation result with a predetermined threshold value.

* * * * *